United States Patent [19]
Shu et al.

[11] Patent Number: 6,037,669
[45] Date of Patent: Mar. 14, 2000

[54] STAGGERED PAD ARRAY

[75] Inventors: William K. Shu, Sunnyvale; Robert L. Payne, San Jose, both of Calif.

[73] Assignee: VLSI Technology, Inc., San Jose, Calif.

[21] Appl. No.: 08/740,758

[22] Filed: Nov. 1, 1996

Related U.S. Application Data

[63] Continuation of application No. 08/224,221, Apr. 7, 1994, abandoned.

[51] Int. Cl.$^7$ ............................. H01L 23/48; H01L 23/52
[52] U.S. Cl. .......................... 257/786; 257/695; 257/784
[58] Field of Search ................................... 257/784, 786, 257/695

[56] References Cited

U.S. PATENT DOCUMENTS

| | | | |
|---|---|---|---|
| 5,153,507 | 10/1992 | Fong et al. | 257/786 |
| 5,355,019 | 10/1994 | Fuchs | 257/786 |

FOREIGN PATENT DOCUMENTS

| | | | |
|---|---|---|---|
| 588481 | 3/1994 | European Pat. Off. | |
| 2 616 964 | 6/1987 | France | |
| 353021566 | 2/1978 | Japan | |
| 360020524 | 2/1985 | Japan | |
| 60-035524 | 2/1985 | Japan | 257/786 |
| 63-093125 | 4/1988 | Japan | 257/786 |
| 63-252434 | 10/1988 | Japan | 257/786 |
| 1-107549 | 4/1989 | Japan | 257/786 |
| 3-034337 | 2/1991 | Japan | 257/786 |
| 4-349640 | 12/1992 | Japan | 257/786 |
| 4-361538 | 12/1992 | Japan | 257/786 |

OTHER PUBLICATIONS

Harmon, "Wire Bonding . . . " Dec. 1992 IEEE Transactions.

*Primary Examiner*—Teresa M. Arroyo

[57] ABSTRACT

A semiconductor die assembly of this invention includes a lead system in which the leads are arranged in a radial pattern. That is, in a group of leads associated with a single side of a semiconductor die, leads which are furthest from the middle are most angled from the perpendicular. The semiconductor die includes an outer row of bond pads which are located proximate to the edge of the semiconductor die and an inner row of bond pads, parallel to the first row and located toward the interior of the semiconductor die surface. In one embodiment, one of the rows of bond pads is regularly spaced, while the other row of bond pads is variably spaced. The bond pads of the variably spaced row are positioned such that a bond wire which connects a bond pad of the inner row to its associated lead will pass substantially medially between the centers of the two closest bond pads of the outer

21 Claims, 8 Drawing Sheets

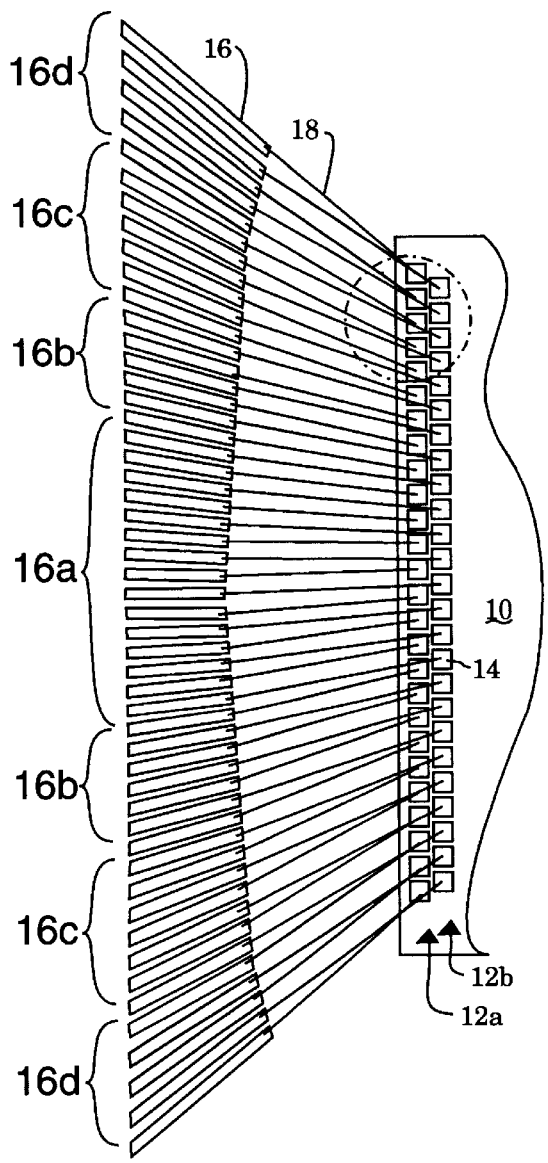
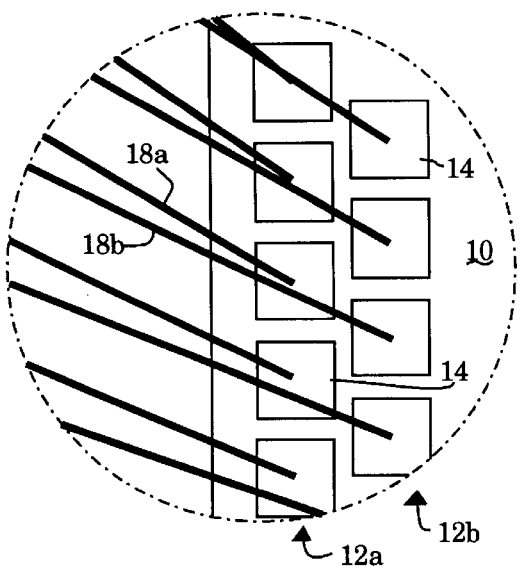
Figure 3b
(Prior Art)
Figure 3a
(Prior Art)

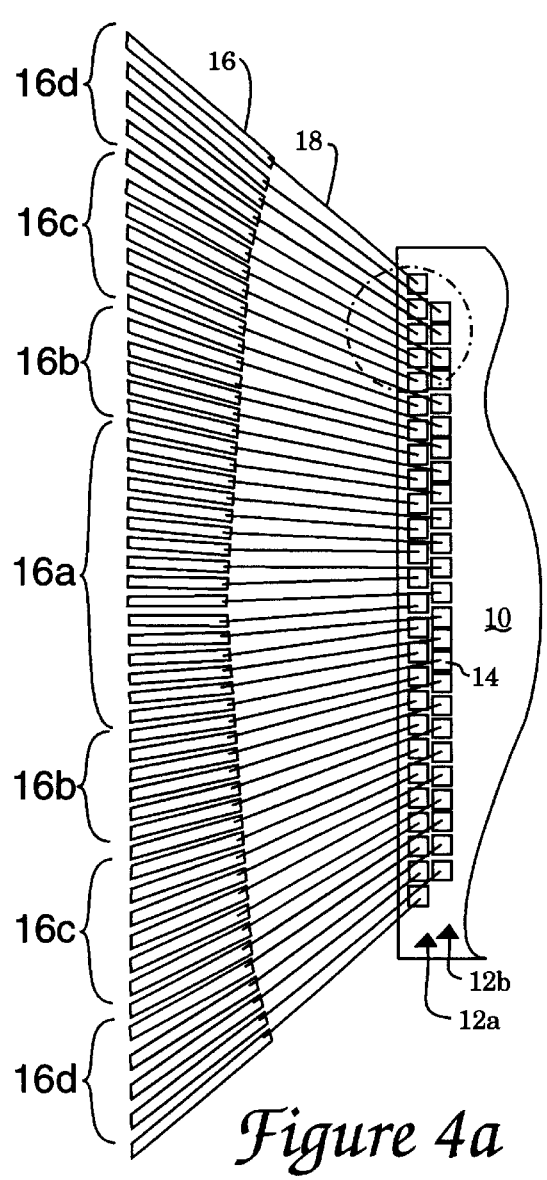
*Figure 4a*
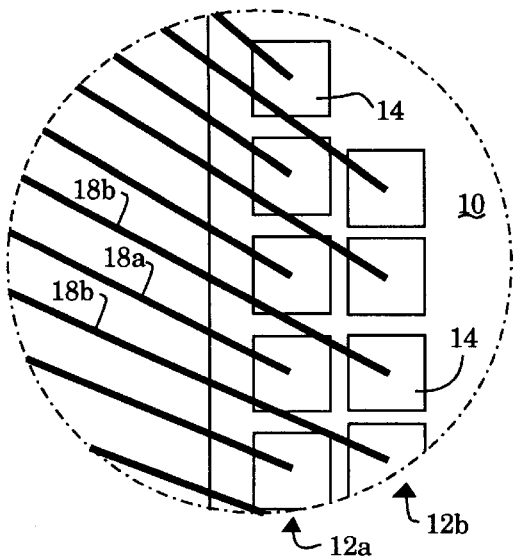
*Figure 4b*
| 0° to 10° from perpendicular | 10° to 20° from perpendicular |
| 20° to 30° from perpendicular | 30° to 45° from perpendicular |
*Figure 4c*

STAGGERED PAD ARRAY

This is a Continuation of application Ser. No. 08/224,221, filed Apr. 7, 1994, now abandoned.

TECHNICAL FIELD

This invention relates to the placement of bond wires and bonding pads in a semiconductor die assembly associated with a radial lead system.

BACKGROUND OF THE INVENTION

Semiconductor devices communicate with their environment of use by accepting electrical impulses supplied by an external source (such as a circuit board) and conducting these impulses to electrical circuits contained on a semiconductor chip. The semiconductor chip reacts to the input in a predetermined manner to generate output. The input and output of electrical impulses to the semiconductor device occur over multiple paths of electrically conducting material, generally referred to as leads.

FIG. 1a shows one edge of a traditional semiconductor die 10 having a row 12 of individual bond pads 14 regularly spaced and arrayed at the periphery of one edge of the semiconductor die 10. A pattern of individual leads 16 is present. Individual bond wires 18 connect a single lead 16 to an individual bond pad 14.

This traditional embodiment uses a pattern of individual leads, each of which is substantially perpendicular to the row of bond pads 14, and thus substantially perpendicular to the edge of the semiconductor chip 10. When the lead pattern includes relatively large parallel leads 16, each of which is substantially perpendicular to a single row of bond pads 14 on the semiconductor die 10, there is only a small chance of shorting (by direct contact between wires) the bond wires which connect the lead and the bond pads. This is shown in FIG. 1b, which shows a close-up of a series of bond pads 14 on a semiconductor die 10, and the bond wires 18 connected to the bond pads 14. While it is possible to include bonding pads along only one, two, or three sides of the surface of a semiconductor die, it is now usual to include bonding pads at or near the perimeter of all four edges of a semiconductor die surface.

As semiconductor chips have decreased in size, one of the limiting factors has been number of available I/O pathways for a given chip. As lead and leadframe technology has progressed, it has been desirable to maximize the number of individual leads 16 which are available in a leadframe. As shown in FIG. 2a, lead size, and the distance between leads, has decreased over the years. However, in order to effectively increase the I/O pathways, both the lead count and the number of bonding pads must be increased.

In order to maximize the number of individual bonding pads which are available on the surface of semiconductor die, the trend has been to provide a maximum number of individual bonding pads arrayed about the periphery of a semiconductor die in multiple rows. FIG. 2a shows one edge of a semiconductor die having two separate, staggered rows of bonding pads 14, an outer row 12a and an inner row 12b.

Electrical connection between an individual bonding pad 14 of the semiconductor die and an electrically conductive lead 16 is made by wire bonding, in which a thin connecting wire 18 is bonded at one end to a die bonding pad 14 (for die input or output), and at the opposite end to a lead finger of an electrical lead 16.

The pictured leads 16 are said to have a "fixed pitch", that is, each lead 16 is parallel to the other leads in the pattern. Optimally, each lead 16 is substantially perpendicular to the edge of the semiconductor die 10. However, due to manufacturing slippage, the leads may be slightly or somewhat skewed from the die-perpendicular position. However, each lead remains parallel to other leads in the pattern.

A variety of specific lead systems are known to the art. For example, lead systems can be made which are suitable for dual in-line packages (DIP), quad packages, pin grid array (PGA) packages, flat packs, surface mount devices (SMDs), or the like. Lead systems can comprise a matrix of metal traces formed in situ as part of the packaging process. Generally, however, leads are manufactured separately from a semiconductor package, for example as part of a leadframe or lead system, and then integrated into a semiconductor package. The specific embodiment of a lead system will vary widely with the specific semiconductor chip and packaging system employed.

The lead system can be made from a solid piece of conductive material which is etched, stamped, or otherwise processed to form individual leads 16. A lead system can, but need not, include a die attach pad (not shown). In some applications, the lead system is formed on a non-conductive layer (not shown) or uses a non-conductive tape structure, such as a polyimide layer (not shown), to maintain individual leads in position during processing. A variety of appropriate metals are known for use as lead material, and the metal used will depend upon the desired conductive attributes and cost. Copper, gold, nickel, cobalt, zinc, lead, tin, titanium, and iron leads are especially appropriate, as are alloys or coatings made of conductive materials.

FIG. 2b shows an enlarged view of the bonding wires 18 and bonding pads 14 of a fixed-pitched lead system having two rows of bonding pads 14 on the semiconductor die 10.

As the lead count and bonding pad count have increased, it has become necessary to provide structures which maximize the spacing of both leads and bonding pads. One such arrangement is shown in FIG. 3a. The bonding pads 14 are regularly spaced in two separate rows. The outer row 12a is adjacent the perimeter of the die. The inner row 12b is located toward the interior of the semiconductor die 10 from the outer row.

The leads are arranged "radially", that is, the leads which are medial to the pattern of leads are substantially perpendicular to the edge of the semiconductor die; leads which are positioned away from the median progressively vary from the perpendicular.

As shown in FIG. 3a, a typical radial lead arrangement includes individual leads of varying pitch. Substantially perpendicular leads 16a are generally perpendicular to the edge of the die; that is, they have angles ranging from about 0° to 10° from the perpendicular. Moderately radial leads 16b vary between about 10° and 20° from the perpendicular. Radial leads 16c vary between about 20° and 30° from the perpendicular. Extremely radial leads 16d vary from about 30° to 45° or more from the perpendicular.

Bond wires connecting substantially perpendicular leads 16a to the semiconductor die demonstrate minimal shorting problems, as the bond wires are substantially parallel. There is little variation in the center-to-center measurement along the length of adjacent bond wires. The bonding process is relatively simple, as bonding pads are unlikely to be occluded by previously-bonded wires. As the pitch of the leads, and the pitch of the bond wires, increases in angle from the perpendicular, problems increase. Moderately radial leads 16b demonstrate relatively more problems with shorting of adjacent wires during wire bonding or during fill.

Bonding pads are more likely to be occluded by the bonding of adjacent wires. Radial leads 16c show substantial problems with shorting, either during the wire bond process or during fill. Bonding pads are likely to be occluded by previously-bonded wires, which leads to failure of the bond, and failure of the packaged die. Extremely radial leads 16d are very likely to short during wire bonding and/or during fill procedures. The wire pattern for extremely radial leads is such that it is very likely that bond wires will occlude the bonding pads of the adjacent bond wires.

The problems with wire bonding from radial leads 16c and from extremely radial 16d leads is shown in magnified view in FIG. 3b. Due to the radial configuration of the leads (not visible in the magnified view) and the regular spacing of the bonding pads 14, bond wires 18b which are bonded to bonding pads of the inner row 12b pass very close to the bond wires 18a which are bonded to bonding pads of the outer row 12a. This increases the odds of shorting between bond wires during bonding processes or during fill processes. In addition (and as especially visible near the top of the magnified view), the bond wire of one lead may substantially occlude the bonding pad site for bonding an adjacent lead.

Problems in connecting radial lead patterns have been noted in the past. One method for avoiding the shorting and/or the occlusion problems is referred to as "high/low" bonding (not shown). This bonding pattern uses bonding wire loops of different heights to help maintain separation between the individual bonding wires. While high/low bonding patterns provide increased separation between bonding wires during the bonding procedure itself, there are significant drawbacks to the system during fill phases, i.e., when a protective coating is applied over the bond wires or when a housing is formed over the bond wires. The "high" bond wires have increased length, and thus are more flexible than the "low" bond wires. During a fill process, the "high" bond wires are easily flexed out of their original position and into a shorting relationship with adjacent wires. When the bond wire length is in the same direction as the flow direction of the fill material, the problem is somewhat reduced. However, this problem is especially notable when high/low bond wires are located 90° from the source of the fill material.

The prior art bonding patterns and systems have not provided an adequate wire bonding when radial leads are present. Specifically, prior art wire bonds tend to short during bonding or fill procedures when closely positioned adjacent wires touch. Additionally, bonding pads may be occluded by bond wires which have already been placed, leading to a failure of the bond process or to shorting between bond wires.

SUMMARY OF THE INVENTION

According to one embodiment of the present invention, a semiconductor die assembly includes a lead system in which the leads are arranged in a radial pattern. That is, in a group of leads associated with a single edge of a semiconductor die surface, leads which are furthest from the middle are most angled from the perpendicular. The semiconductor die includes an outer row of bond pads which are located proximate to the edge of the semiconductor die. The semiconductor die also includes an inner row of bond pads, parallel to the outer row and located toward the interior of the semiconductor die surface. Individual pads in one of the inner or outer rows are substantially regularly spaced. The other row of bond pads are spaced such that a bond wire which connects a bond pad of the inner row to its associated lead will pass substantially medially between the centers of the two closest bond pads of the outer row. In one embodiment, at least one lead is at least 20 degrees offset from a line perpendicular to the edge of the die and in another embodiment, at least one lead is at least 30 degrees offset from a line perpendicular to the edge of the die.

The above summary is not intended to characterize every embodiment of the present invention.

BRIEF DESCRIPTION OF THE DRAWINGS

FIG. 1b shows an enlarged view of the circled portion of FIG. 1a.

FIG. 2b shows an enlarged view of the circled portion of FIG. 2a.

FIG. 3 shows one edge of a prior art semiconductor die 10 and the inner portion of its associated radial leads 16 and bond wires 18, in top view. FIG. 3b shows an enlarged view of the circled portion of FIG. 3a.

FIG. 4a is one edge of a semiconductor die 10 and the inner portion of its associated radial leads 16 and bond wires 18, in top view. FIG. 4b shows an enlarged view of the circled portion of FIG. 4a. FIG. 4c shows a line perpendicular to the edge of the semiconductor die shown FIG. 4a, and illustrates the measurement of radial leads.

FIG. 5b shows an enlarged view of the circled portion of FIG. 5a.

The Figures are drawn for clarity and are not drawn to scale. Similar numbers refer to similar structures throughout the Figures.

DETAILED DESCRIPTION OF VARIOUS EMBODIMENTS

Figure 1A:
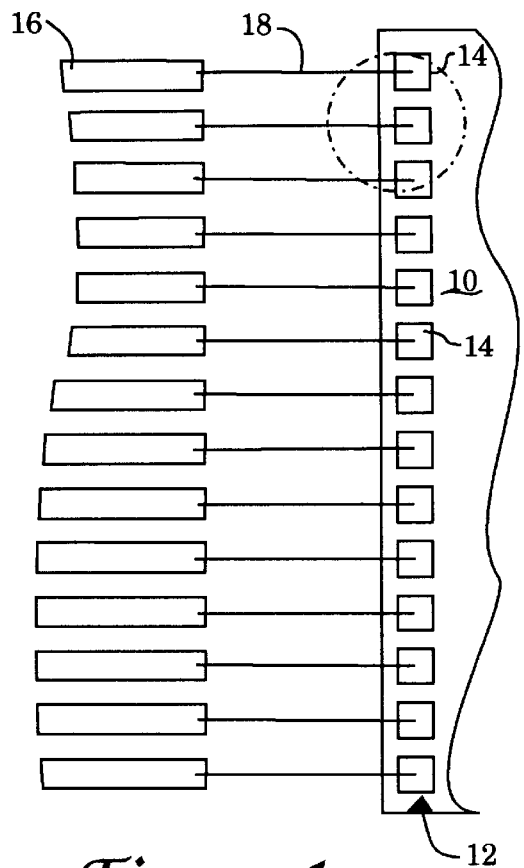
FIG. 1a hows one edge of a prior art semiconductor die 10 and the inner portion of its associated fixed-pitch leads 16 and bond wires 18, in top view.
Figure 1B:
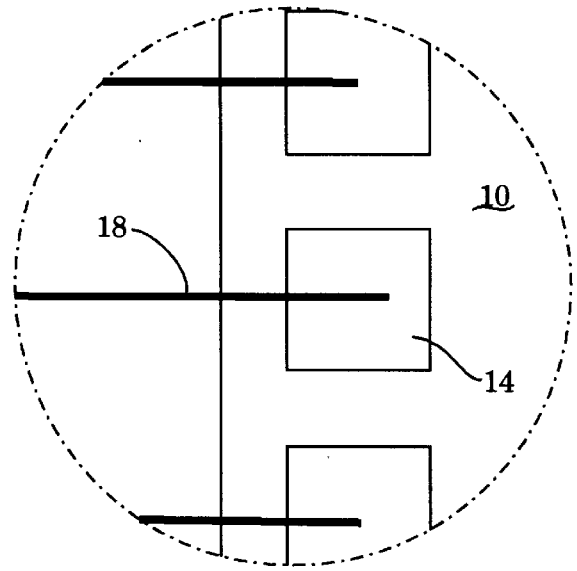
Figure 2A:
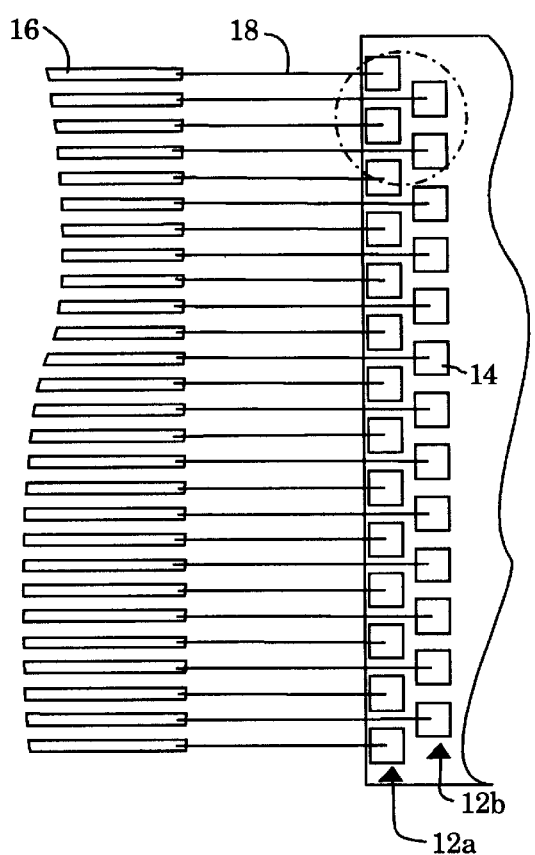
FIG. 2a shows one edge of a prior art semiconductor die 10 and the inner portion of its associated fixed-pitch leads 16 and bond wires 18, in top view.
Figure 2B:
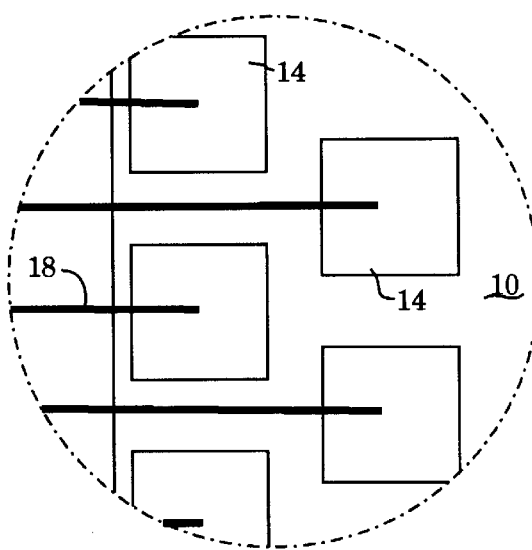
Figure 5A:
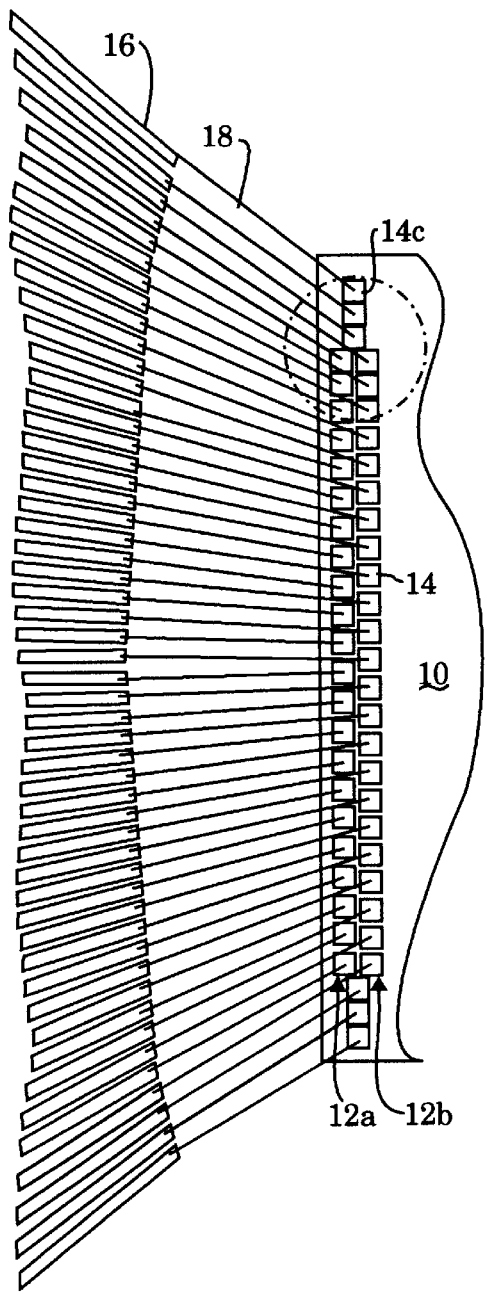
FIG. 5a shows an alternate embodiment of one edge of a semiconductor device 10 and the inner portion of its associated radial leads 16 and bond wires 18, in top view.

The invention herein relates to a semiconductor die assembly. As shown in FIGS. 4a and 5a, the assembly includes a semiconductor die 10 having specifically placed bond pads 14 on a surface. The bond pads are connected to a radially arrayed lead frame or pattern of individual leads 16 using wire bonding methods. Wire bonding generally requires that a thin electrically conductive bond wire 18 is electrically bonded at one end to a single lead 16, and at the opposite end to a single bond pad 14 of the semiconductor die 10.

The critical determination of the bond wire spacing is not at the leads or at the bond pads, as considered in the prior art. The critical determination of bond wire spacing is measured at the point that a bond wire bonded to a bond pad of the inner row passes between two adjacent bond pads of the outer row. In accordance with the teachings of the subject invention, a regularly spaced row of bond pads is parallel to a variably spaced, or unevenly spaced, row of bond pads. The regularly spaced row of bond pads may be in either the inner or outer position. The bond pads of the variably spaced row of bond pads are placed so that a bond wire which connects each bond pad of the inner row to a lead passes substantially medially between the centers of two adjacent bond pads in the outer row of bond pads.

Figure 5B:
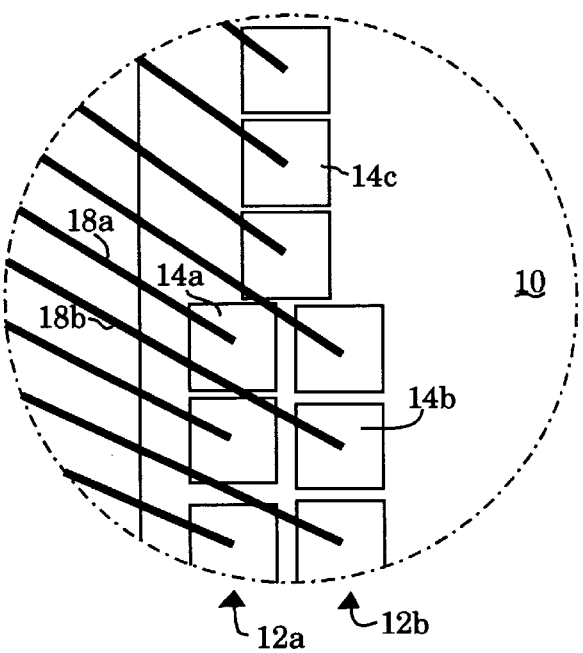

FIGS. 4a and 4b show an embodiment in which the regularly spaced row of bond leads is the outer row. Thus, the variably spaced inner row of bond leads 12b is closer to the center of the die than the regularly spaced outer row of bond leads 12a. FIGS. 5a and 5b show an alternate embodiment in which the regularly spaced row of bond leads is the inner row 12b. That is, the variably spaced outer row of bond leads 12a is closer to the perimeter of the die than is the regularly spaced inner row of bond leads 12b.

For clarity of language, and not by way of limitation, the surface of a semiconductor die which includes the bond pads will be referred to and drawn as the "upper" surface. Spatial orientation is not critical, of course, and this "upper" surface may have any desired orientation.

Generally, a semiconductor die includes six flat surfaces. While it was once common to have leads extending from only two edges of semiconductor dies, today it is far more common that leads extend from four edges of a single surface of the semiconductor die. For purposes of clarity, and not by way of limitation, the integration of the semiconductor die 10, leads 16, and wire bonds 18 will be described with reference to a single edge of a semiconductor die, such as pictured in FIG. 4a. When four edges of an upper surface of a semiconductor die include bond pads to connect the semiconductor die to the lead system, the bond pad, bond wire, and lead patterns will commonly be substantially repeated on each of the four edges, as shown in FIG. 6.

The specific function of the semiconductor die 10 is not critical to the structures herein. The number of leads and bond pads are not critical, nor is the size of the semiconductor die.

The semiconductor die includes an upper surface usually defined by four edges. At least two rows of bond pads are present along at least a portion of one of the edges. Generally, double rows of bond pads are present along each of the four edges. Additional bond pads (I/O, power, ground, or the like) which are not part of either row may also be present on the surface of the semiconductor.

A bond pad 14 is a metalized surface to which an electrically conductive bonding wire 18 is attached. The bonding can take place manually, but is commonly done by automated processes. The bonding machine must be programmed for the intended chip and lead system. As noted with reference to FIG. 3a, traditional bond pad patterns have proved to be inadequate when combined with radially arrayed lead systems, as bond pads positioned at regular intervals in a two-row system cause interference for adjoining bond pads when the leads and wire bonds are not radially arrayed.

It has been discovered that a substantially regularly spaced row of bond pads can be combined with a variably spaced, or staggered, row of bond pads, to provide good wire bonding patterns. As noted above, the critical determination of the bond wire spacing is not at the leads or at the bond pads, as considered in the prior art. The critical determination of bond wire spacing is measured at the point that a bond wire passes between two adjacent bond pads of the outer row.

Rows of bond pads will generally be comprised largely of individual I/O bond pads of similar size and shape. In the embodiment shown in FIG. 4a, the variably spaced row of bond pads is the outer row 12a. It is located proximate to the edge of the upper surface of the semiconductor die. The specific placement of the outer row of bond pads is not critical; however, in general, the closer to the edge of the die that the row is placed, the greater the row length can be. Individual bond pads within the variably spaced row are positioned with reference to the specific lead system used and the placement of individual bond pads in the regularly spaced row of bond pads. The center-to-center measurement of adjoining bond pads will not be substantially equal throughout the variably spaced row. Instead, the center-to-center measurement of adjoining bond pads will vary along the length of the row. The centers of the bond pads of the variably spaced row are primarily aligned with respect to the bonding pads of the regularly spaced row and to the angle of the bond wire, and only secondarily aligned with reference to the center-to-center measurements of the other bond pads of the variably spaced row.

A regularly spaced inner row of bond pads 12b is positioned nearer the center of the die surface than the variably spaced outer row of bond pads 12a. The regularly spaced inner row of bond pads 12b is generally parallel to the variably spaced outer row of bond pads 12a, and is thus also generally parallel to the edge of the semiconductor die. However, the center-to-center measurement of adjacent bond pads within the regularly spaced row is substantially equal all along the length of the row.

Because power and ground pads require different structures than I/O pads, they are commonly placed outside the rows of I/O bond pads. Conveniently, the power and ground pads are placed in the corners of the die, and are not part of the rows of bond pads.

Radially aligned lead systems may be thought of as gradually varying systems. An analysis of different lead and bond wire pitches is demonstrated graphically with reference to FIGS. 4a through 4c.

When the leads are arranged radially, as discussed above, the prior art bond pad configurations yield unacceptable results. In a two-row system, leads 16a which are medial to the pattern of leads, and which are therefore substantially perpendicular to the edge of the semiconductor die, are optimally connected to bond pads in which the center of each bond pad of the inner row is positioned medially between the centers of bond pads of the outer row, as discussed and shown in the prior art.

However, leads which are removed from the medial leads are at a significant angle to the perpendicular. Prior art bond pad patterns place the bond pads such that the center-to-center distance is consistent, regardless of the pitch of the bond wire. It has been discovered that bond pad occlusion, bond wire shorting, and fill failures can be minimized or eliminated if the bond pads are placed such that the bond wires 18b attached to bond pads of the inner row 12b pass medially between the bond pads of the outer row 14a, regardless of the pitch of the bond wire. Bond pads of one of the parallel rows are therefore staggered in position within the row, to position the bond wires connected to bond dies of the inner row substantially medially between the centers of the bond dies of the outer row, regardless of the pitch of the bond wire.

Moderately radial leads 16b, which vary between about 10° and 20° from the perpendicular, suffer shorting and fill failures at a somewhat greater rate than substantially perpendicular leads 16a with traditional bond pad placement. Radial leads 16c vary between about 20° and 30° from the perpendicular, and shorting and fill failures may reach unacceptable levels. Extremely radial leads 16d vary from about 30° to 45° or more from the perpendicular, and are relatively likely to demonstrate shorting, bonding, and/or fill failures at unacceptable rates.

The pattern of leads associated with a single edge of a semiconductor die will generally include leads which are substantially perpendicular to the edge of the die medial to the lead pattern, varying regularly to at least 20° from perpendicular at the extremes of the pattern. More generally, the leads will vary, at the extreme, by at least 25° to 30° or more from perpendicular.

Leads may be of substantially equal width along the entire length of the lead or, more commonly, may vary in width along the length. For example, individual leads can vary in width from less than 0.003 inches wide to greater than 0.100 inches wide. Lead thickness is usually in the range of from about 0.004 inches to about 0.010 inches.

The regular pattern of leads which are associated with a single edge of the semiconductor die will generally be I/O leads. Power and ground leads may be included in the regular pattern of leads, or they may be separate leads which do not vary with the general lead pattern.

The lead system can be made from a solid piece of conductive material which is etched, stamped, or otherwise processed to form individual leads 16. A lead system can, but need not, include a die attach pad. In some applications, the lead system is formed on a non-conductive layer (not shown) or uses a non-conductive tape structure, such as a polyimide layer (not shown) to maintain individual leads in position during processing. The lead system is made of a conductive material, generally a metal. The specific metal used will generally depend upon the desired conductive attributes, and cost. Leads of copper, gold, nickel, lead, tin, alloys or combinations thereof, or plated layers are typical. The lead system is patterned to provide a plurality of individual electrical leads, each of which is electrically connected to the semiconductor chip at one end, and extends to or toward the periphery of the semiconductor package at the opposite end. It is common for individual leads to be integrated into a leadframe structure during some portions of manufacture. However, a leadframe is separated into individual leads before the semiconductor package is put into use.

Bond pad placement of FIG. 4a is shown in detail in FIG. 4b. In a two-row bond pad layout, the bond wires generally alternate between the outer and inner rows. For example, a bond wire 18a is attached to a lead on one end (not shown), and to a bond pad of the outer row of bond pads 12a on the other end. The bond wires 18b which are next to it on either side are each connected at one end to a lead (not shown), and at the other end to a bond pad of the inner row of bond pads 12b.

The specific placement of the bond pads within the variably spaced row will vary with the specific embodiment of the radial system of leads, the distance of the outer and inner rows from the perimeter of the semiconductor die, and the spacing between bond pads within and between rows. In general, the more radial the lead and bond wire, the more the corresponding bond pad must be offset within a variably spaced row.

As shown in one specific example in FIG. 4b, the bond pads of the inner row may be aligned "behind" the bond pads of the outer row for extremely radial leads and bond wires. However, for substantially perpendicular leads and bond wires (see FIG. 4a), the more traditional medial placement spacing is used.

The bond wires which are appropriate for use are those well known in the art. Generally, the bond wires provide an electrical connection between an individual lead and a single bond pad on the upper surface of the semiconductor die. Bond wires can be of any appropriate conductive material. Commonly, gold wire having a cross-sectional diameter of from about 1 mil or less, to about 1.3 mil or more, is used. Each bond wire is soldered to at one end to a single lead, and at the opposite end to a single bond pad.

When bond wires are used it is common to include a silicone gel to cover and protect the bond wires and connections. The gel acts to encapsulate the leads and provide a stress relief for the leads during assembly. Alternatively, a non-conductive potting or packaging material may be introduced to cover and immobilize the bond wires.

A variety of housing schemes can be used to protect the semiconductor apparatus of this invention. For example, a semiconductor apparatus of this invention can be processed into plastic, ceramic, metal, PGA, and other such package types.

One preferred embodiment is shown in FIGS. 5a and 5b. The assembly includes a semiconductor die 10 having specifically placed bond pads 14 on a surface. The bond pads are connected to a radially arrayed lead frame or pattern of individual leads 16 using wire bonding methods. Wire bonding generally requires that a thin electrically conductive bond wire 18 is electrically bonded at one end to a single lead 16, and at the opposite end to a single bond pad 14 of the semiconductor die 10.

FIGS. 5a and 5b show an embodiment in which the variably spaced row of bond leads is the outer row. That is, the regularly spaced inner row of bond leads 12b is closer to the center of the die than the variably spaced outer row of bond leads 12a.

The embodiment shown in FIGS. 5a and 5b is generally preferred. The placement of the variably spaced row in the outer position permits more room for placement of individual bond pads within the row than when the variably spaced row is in the inner position.

As noted above, the critical determination of the bond wire spacing is not at the leads or at the bond pads, as considered in the prior art. Rather, the critical determination of bond wire spacing is measured at the point that a bond wire of an inner row passes between two adjacent bond pads of the outer row. The position of the bond pads within the variably spaced row should be calculated so that a bond wire connected to the inner row of bond pads passes at or near the medial point between the centers of adjacent outer row bon pads.

Because power and ground pads require different structures than I/O pads, they are commonly placed outside the rows of I/O bond pads. Conveniently, the power and ground pads are placed in the corners of the die, and are not part of the rows of bond pads. For some applications, however, it may be desirable to have ground or power pads located as part of the inner or outer rows of bond pads. Similarly, it may be desirable to have I/O pads located outside the boundaries of the inner and outer row positions. A preferred embodiment is shown in FIGS. 5a and 5b, in which a series of single bond pads 14c are located near the inner row 12b and outer row 12a of bond pads.

The specific placement of the bond pads of the variably spaced row will vary with the specific embodiment of the radial system of leads, the distance of the outer and inner rows from the perimeter of the semiconductor die, and the spacing between bond pads within and between rows. In general, the more radial the lead and bond wire, the more the corresponding bond pad must be offset within the variably spaced row.

FIGS. 5a and 5b show an embodiment in which the variably spaced row of bond leads is the outer row. That is, the regularly spaced inner row of bond leads 12b is closer to the center of the die than the variably spaced outer row of bond leads 12a.

Figures 6A, 6B:
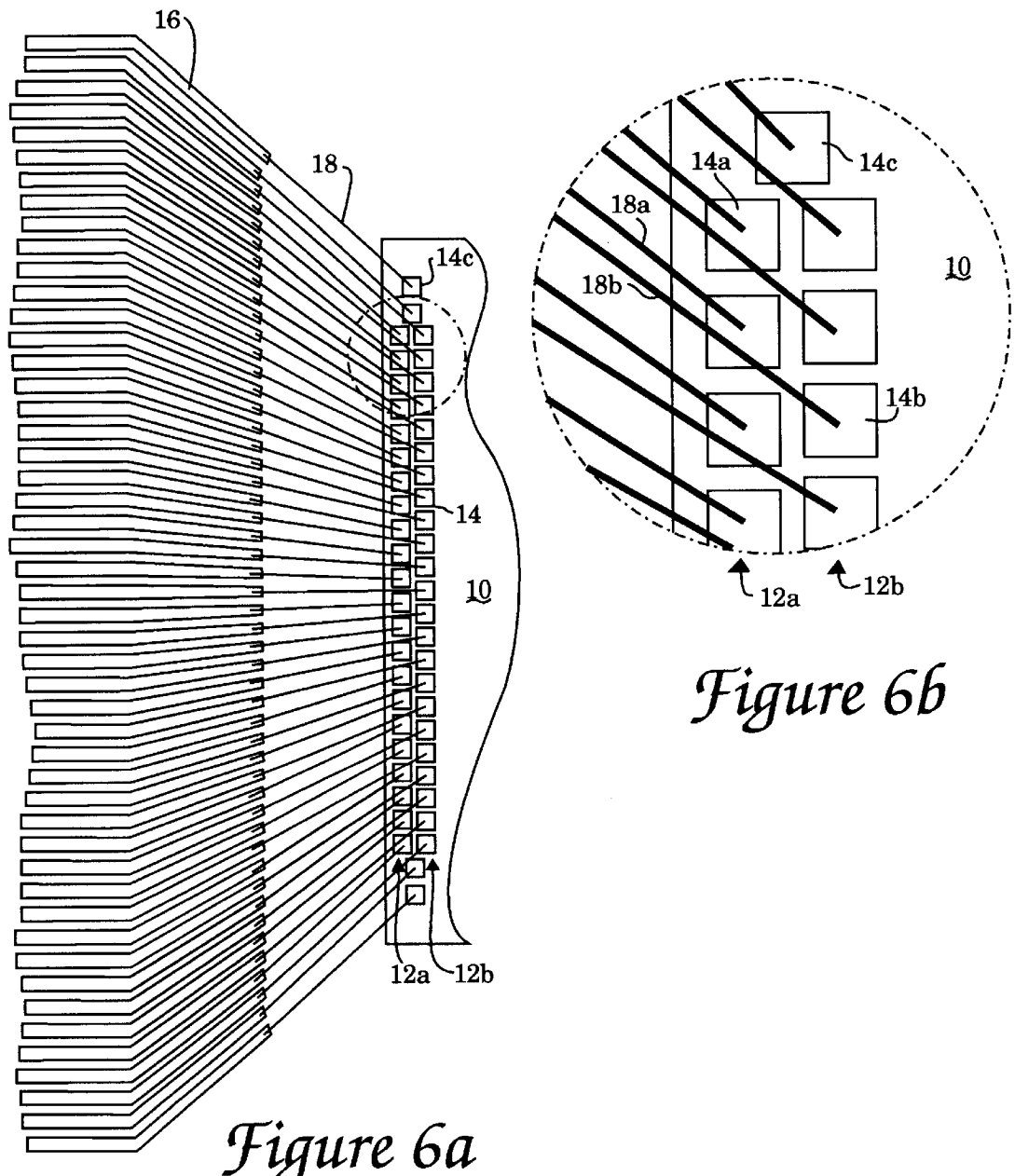
FIGS. 6a, 6b, and FIG. 7 each shows an alternate embodiment of one edge of semiconductor device 10 and the inner portion of its associated radial leads 16 and bond wires 18, in top view.

The embodiment shown in FIGS. 6a and 6b shows a bond pad placement embodiment in which two substantially evenly spaced rows of substantially equal length are positioned parallel to each other and to the edge of the die. The outer row includes n die pads, where n is generally 4 or greater, more usually 10 or greater. The inner row includes n+1 die pads. This embodiment provides a general approximation of the variably spaced embodiments described above, while permitting easily determined or automated pad placement design.

The assembly includes a semiconductor die 10 having bond pads 14 on a surface. The bond pads 14 are connected to a radially arrayed lead frame or pattern of individual leads 16 using wire bonding methods. Wire bonding generally requires that a thin electrically conductive bond wire 18 is electrically bonded at one end to a single lead 16, and at the opposite end to a single bond pad 14 of the semiconductor die 10.

Figure 7:
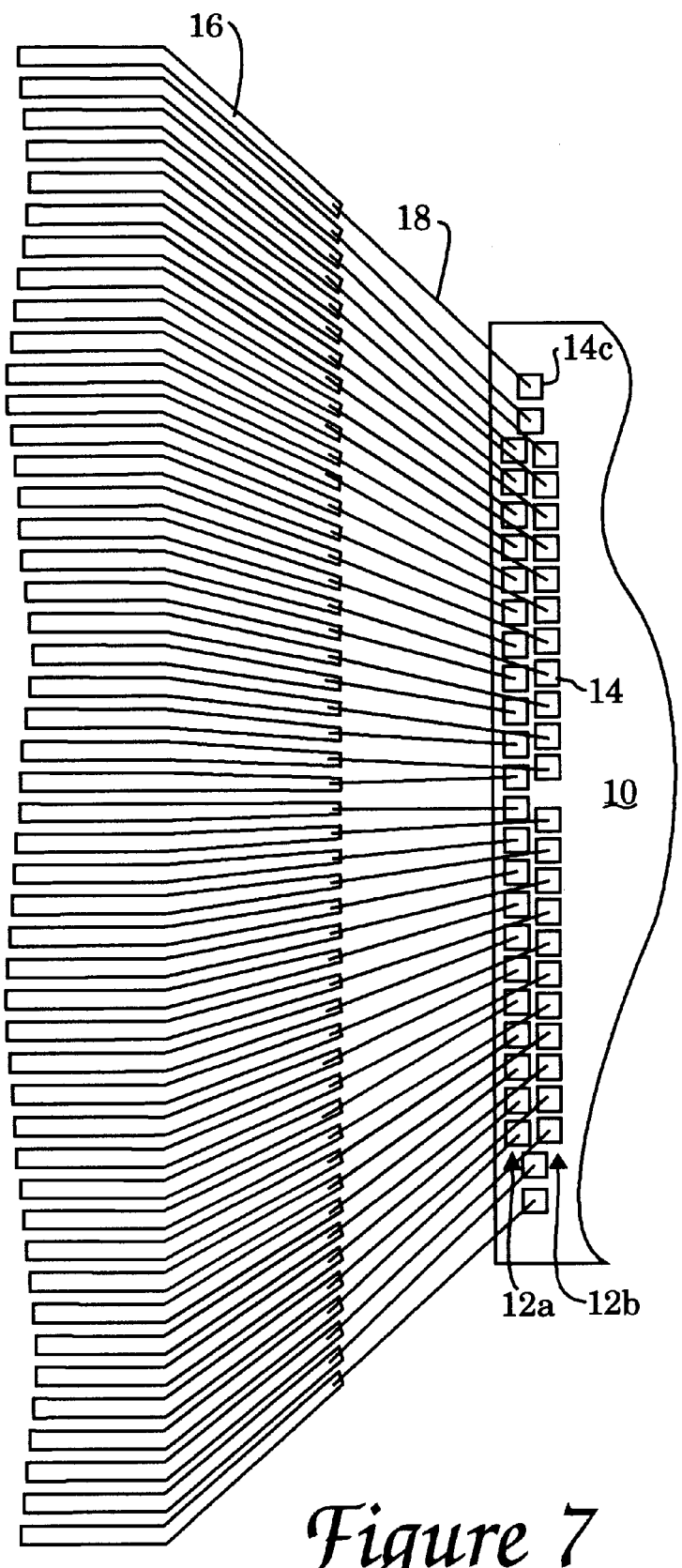

FIG. 7 shows an assembly similar to that of FIG. 6a. The assembly of FIG. 6a, however, generally results in an odd number (n+n+1) of die pads on each edge of the die 10. It is common in the industry for each edge of the die 10 to provide an even number of bond pads. This can be accomplished by providing the embodiment of FIG. 6a with additional single bond pads 14c. However it may be preferable to reach the same goal by the method shown in FIG. 7. As shown in FIG. 7, a single bond pad placement in the otherwise regular inner row 12b is left unfilled. While the remaining bond pads 14 of the inner row 12b are bilaterally symmetrical, the inner row 12b of bond pads as a whole is irregularly spaced. This embodiment is thus similar to the embodiment shown in FIG. 5: an evenly spaced outer row 12a is combined with a variably spaced inner row 12b.

Figure 8:
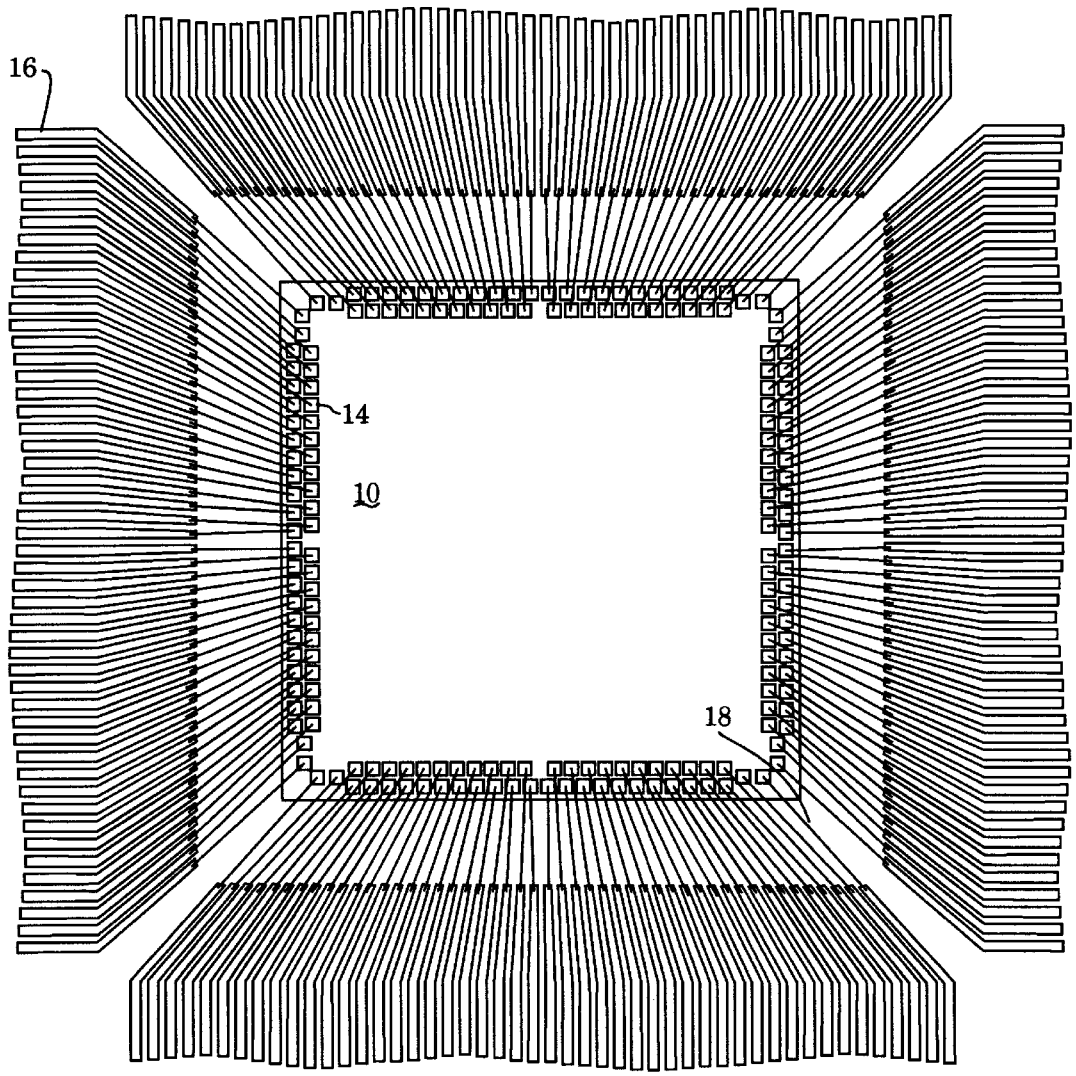
FIG. 8 shows a top view of a semiconductor die 10 and the inner portion of its associated radial leads 16 and bond wires 18, in top view.

FIG. 8 shows a semiconductor die 10 with bond wires 18 and the inner portion of the associated lead system of individual leads 16. Each edge of the semiconductor die 10 has two rows of associated bond pads 14 of substantially equal length. As discussed above, this will be a usual configuration. Semiconductor dies having three or more rows of bond pads associated with a single edge (not shown) can also be constructed in conformance with the disclosure herein.

While the invention has been described in connection with several exemplary embodiments, it will be understood that many modifications will be apparent to those of ordinary skill in the art in light of the above disclosure. Such modifications may include using substitute materials, smaller or greater dimensions, more than one die in a package, greater or lesser numbers of bond pads, lead systems having greater or lesser pitch and number of leads, different types of integrated circuit devices, a variety of different packaging schemes, and so forth, to achieve substantially the same results in substantially the same way. Reference to the following claims should be made to determine the scope of the claimed invention.

We claim:

1. A semiconductor die assembly comprising:
    a semiconductor die having at least one surface edge including an outer row of bond pads which are substantially evenly spaced and positioned near said surface edge of said semiconductor die, said outer row of bond pads having n bond pads in said outer row, and an inner row of substantially evenly spaced bond pads parallel to said outer row of bond pads, said inner row of bond pads having n+1 bond pads in said inner row, said inner row of bond pads is substantially equal in length to said outer row of bond pads; wherein individual bond pads of said inner row of bond pads are positioned such that individual bond wires that provide an electrical connection between an individual lead and a bond pad of the inner row of bond pads passes substantially medially between adjacent bond pads of said outer row of bond pads;
    a radially arrayed pattern of individual leads associated with said edge of said semiconductor die and including at least one individual lead being at least 20° offset from a line perpendicular to the edge of said semiconductor die; and
    a plurality of bond wires wherein each wire provides an electrical connection between a single bond pad and an individual lead.

2. A semiconductor die assembly of claim 1 wherein additional bond pads are present on the surface of the semiconductor die, said additional bond pads being located apart from said outer row of bond pads and said inner row of bond pads.

3. A semiconductor die assembly of claim 2 wherein said additional bond pads are selected from the group consisting of power pads and ground pads.

4. A semiconductor die assembly comprising:
    a semiconductor die having at least one surface edge including an outer row of bond pads which are substantially evenly spaced and positioned near said surface edge of said semiconductor die, said outer row of bond pads having n bond pads in said outer row, and an inner row of substantially evenly spaced bond pads parallel to said outer row of bond pads, said inner row of bond pads having n+1 bond pads in said inner row, said inner row of bond pads is substantially equal in length to said outer row of bond pads; wherein individual bond pads of said inner row of bond pads are positioned such that individual bond wires that provide an electrical connection between an individual lead and a bond pad of the inner row of bond pads passes substantially medially between adjacent bond pads of said outer row of bond pads;
    a radially arrayed pattern of individual leads associated with said edge of said semiconductor die and including at least one individual lead being at least 30° offset from a line perpendicular to the edge of said semiconductor die; and
    a plurality of bond wires wherein each wire provides an electrical connection between a single bond pad and an individual lead.

5. A semiconductor die assembly comprising:
    a semiconductor die having parallel rows of bond pads including an inner row of bond pads and an outer row of bond pads, wherein a bond wire which connects a bond pad of said inner row of bond pads to a lead passes substantially medially between the centers of two adjacent bond pads of the outer row;
    a lead system in which individual leads are arranged in a radial pattern, said lead system further comprising a group of individual leads associated with each edge of the semiconductor die, wherein individual leads which are positioned furthest from the center of each edge of said semiconductor die are most angled from a line perpendicular to said edge of said semiconductor die and wherein at least one lead is at least 20 degrees offset from a line perpendicular to the edge of the die; and a multiplicity of bond wires arranged to connect individual leads to individual bond pads.

6. A semiconductor die assembly of claim 5, said semiconductor die further comprising an outer row of bond pads that are substantially evenly spaced, said outer row of bond pads having n bond pads in said outer row, and an inner row of bond pads which are substantially evenly spaced, said inner row of bond pads having n+1 bond pads in said inner row, wherein said inner row of bond pads and said outer row of bond pads are substantially equal in length.

7. A semiconductor die assembly of claim 5 wherein additional bond pads are present on the surface of the semiconductor die, said additional bond pads being located apart from said outer row of bond pads and said inner row of bond pads.

8. A semiconductor die assembly of claim 7 wherein said additional bond pads are selected from the group consisting of power pads and ground pads.

9. A semiconductor die assembly comprising:

a semiconductor die having parallel rows of bond pads including an inner row of bond pads and an outer row of bond pads, wherein a bond wire which connects a bond pad of said inner row of bond pads to a lead passes substantially medially between the centers of two adjacent bond pads of the outer row;

a lead system in which individual leads are arranged in a radial pattern, said lead system further comprising a group of individual leads associated with each edge of the semiconductor die, wherein individual leads which are positioned furthest from the center of each edge of said semiconductor die are most angled from a line perpendicular to said edge of said semiconductor die and wherein at least one lead is at least 30 degrees offset from a line perpendicular to the edge of the die; and a multiplicity of bond wires arranged to connect individual leads to individual bond pads.

10. A semiconductor die assembly comprising:

a semiconductor die having parallel rows of bond pads including an inner row of bond pads and an outer row of bond pads, wherein a bond wire which connects a bond pad of said inner row of bond pads to a lead passes substantially medially between the centers of two adjacent bond pads of the outer row; and a lead system in which individual leads are arranged in a radial pattern, said lead system further comprising a group of individual leads associated with each edge of the semiconductor die, wherein at least one lead is at least 20 degrees offset from a line perpendicular to the edge of the die; and a multiplicity of bond wires arranged to connect individual leads to individual bond pads.

11. A semiconductor die assembly comprising:

a semiconductor die having parallel rows of bond pads including an inner row of bond pads and an outer row of bond pads, wherein a bond wire which connects a bond pad of said inner row of bond pads to a lead passes substantially medially between the centers of two adjacent bond pads of the outer row; and a lead system in which individual leads are arranged in a radial pattern, said lead system further comprising a group of individual leads associated with each edge of the semiconductor die, wherein at least one lead is at least 30 degrees offset from a line perpendicular to the edge of the die; and a multiplicity of bond wires arranged to connect individual leads to individual bond pads.

12. A semiconductor die assembly, according to claim 10, further including additional power and ground pads located apart from said outer row of bond pads and said inner row of bond pads.

13. A semiconductor die assembly, according to claim 10, further including an outer row of n bond pads that are substantially evenly spaced, an inner row of n+1 bond pads that are substantially evenly spaced.

14. A semiconductor die assembly, according to claim 10, further including an outer row of n bond pads that are substantially evenly spaced, an inner row of n+1 bond pads that are substantially evenly spaced, and further including additional power and ground pads located apart from said outer row of bond pads and said inner row of bond pads.

15. A semiconductor die assembly, according to claim 10, further including an outer row of bond pads that are substantially variably spaced, and an inner row of bond pads that are substantially evenly spaced.

16. A semiconductor die assembly, according to claim 10, further including an outer row of bond pads that are substantially evenly spaced, and an inner row of bond pads that are substantially variably spaced.

17. A semiconductor die assembly, according to claim 10, further including PGA packaging.

18. A semiconductor die assembly, according to claim 11, further including additional power and ground pads located apart from said outer row of bond pads and said inner row of bond pads.

19. A semiconductor die assembly, according to claim 11, further including an outer row of n bond pads that are substantially evenly spaced, an inner row of n+1 bond pads that are substantially evenly spaced.

20. A semiconductor die assembly, according to claim 11, further including an outer row of n bond pads that are substantially evenly spaced, an inner row of n+1 bond pads that are substantially evenly spaced, and further including additional power and ground pads located apart from said outer row of bond pads and said inner row of bond pads.

21. A semiconductor die assembly, according to claim 11, further including an arrangement according to one of the following: an outer row of bond pads that are substantially variably spaced, and an inner row of bond pads that are substantially evenly spaced; and an outer row of bond pads that are substantially evenly spaced, and an inner row of bond pads that are substantially variably spaced.

* * * * *